United States Patent [19]

Kondo

[11] Patent Number: 4,533,932

[45] Date of Patent: Aug. 6, 1985

[54] SEMICONDUCTOR DEVICE WITH ENLARGED CORNERS TO PROVIDE ENHANCED PUNCH THROUGH PROTECTION

[75] Inventor: Takeo Kondo, Kawasaki, Japan

[73] Assignee: Tokyo Shibaura Denki Kabushiki Kaisha, Japan

[21] Appl. No.: 451,412

[22] Filed: Dec. 20, 1982

Related U.S. Application Data

[63] Continuation of Ser. No. 131,425, Mar. 18, 1980, abandoned.

[30] Foreign Application Priority Data

Mar. 22, 1979 [JP] Japan .................................. 54-32254
Nov. 10, 1979 [JP] Japan ................................ 54-145733
Nov. 10, 1979 [JP] Japan ................................ 54-145738

[51] Int. Cl.$^3$ ........................................... H01L 29/90
[52] U.S. Cl. ...................................... 357/13; 357/20; 357/42; 357/52
[58] Field of Search ..................... 357/13, 20, 42, 52, 357/41

[56] References Cited

U.S. PATENT DOCUMENTS

| | | | |
|---|---|---|---|
| 3,214,652 | 10/1965 | Knowles | 357/20 |
| 3,404,295 | 10/1968 | Warner | 357/13 |
| 3,461,324 | 8/1969 | Barry | 357/20 |
| 3,538,398 | 11/1970 | Whiting | 357/13 |
| 3,832,732 | 8/1974 | Roberts | 357/20 |
| 4,066,918 | 1/1978 | Heuner et al. | 357/42 |
| 4,361,846 | 11/1982 | Tsukuda | 357/13 |

FOREIGN PATENT DOCUMENTS 0018487 3/1980 European Pat. Off. ............. 357/20

Primary Examiner—Joseph E. Clawson, Jr.
Attorney, Agent, or Firm—Finnegan, Henderson, Farabow, Garrett & Dunner

[57] ABSTRACT

A method is provided by the present invention for manufacturing a semiconductor device which includes supplying an impurity for forming an impurity area in a semiconductor substrate wherein the amount of the impurity defining the corners of said area is adjusted so that the shape of said corners is controlled. In this method, adjustment of the amount of the impurity may be accomplished by supplying the impurity to said substrate by using a mask whose corners are enlarged or reduced for increasing or reducing the opening area of the mask. The adjustment of the amount of the impurity may alternatively be accomplished by supplying an impurity of conductivity type opposite to that of said impurity to the places where the corners are to be formed.

3 Claims, 39 Drawing Figures

SEMICONDUCTOR DEVICE WITH ENLARGED CORNERS TO PROVIDE ENHANCED PUNCH THROUGH PROTECTION

This is a continuation, of application Ser. No. 131,425 filed 3-18-80 now abandon.

The present invention relates to a method for forming a semiconductor device of high component density, especially an integrated circuit device, and to a integrated circuit device manufactured by this method.

Figures 1, 4:
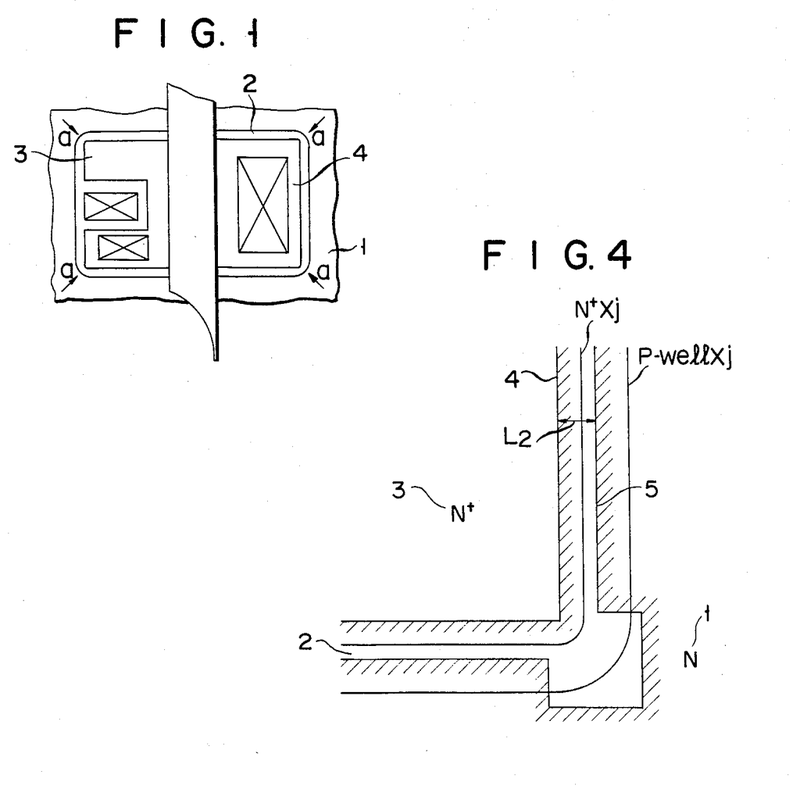
FIG. 1 is a plan view of a conventional semiconductor device.
FIG. 4 is a plan view illustrating the impurity atom density profile in the vicinity of the mask corners in a first embodiment of the present invention.

An integrated circuit device of CMOS (Complementary Metal Oxide Semiconductor) structure, for example, a CMOS-RAM (Random Access Memory) has a p-channel MOS FET (not shown) in addition to an n-channel MOS FET (fieldeffect transistor) as shown in FIG. 1. In FIG. 1, numeral (1) denotes an n-type silicon body. Within this body (1) a p-well (2) is formed, in which in turn are formed an n+ source area or region (3) and an n+ drain area (4) respectively. In order to form a CMOS-RAM of high component density with an n-channel MOS FET of such a structure, it is necessary to shorten the distance between the p-well (2) and the n+ source area (3) or the distance between the p-well (2) and the n+ drain area (4). However, in such a case, punch-through phenomenon often occurs between the n+ source area (3) - p-well (2) - n body (1), and between the n+ drain area (4) - p-well (2) - n body (1) in the corners (a) of the p-well (2), causing the circuit to operate incorrectly. The cause of the punch-through phenomenon at the corners (a) of the p-well is considered to be attributable to the fact that the distance between the corners (a) of the p-well (2) and the corresponding corners of the source and drain areas (3) and (4) is smaller than the distance between the other parts of the p-well (2) and the other parts of the source and drain areas (3) and (4), that is, to the fact that the p-well (2) and the source and drain areas (3) and (4) are closest to each other at the corners (a).

Figure 2A:
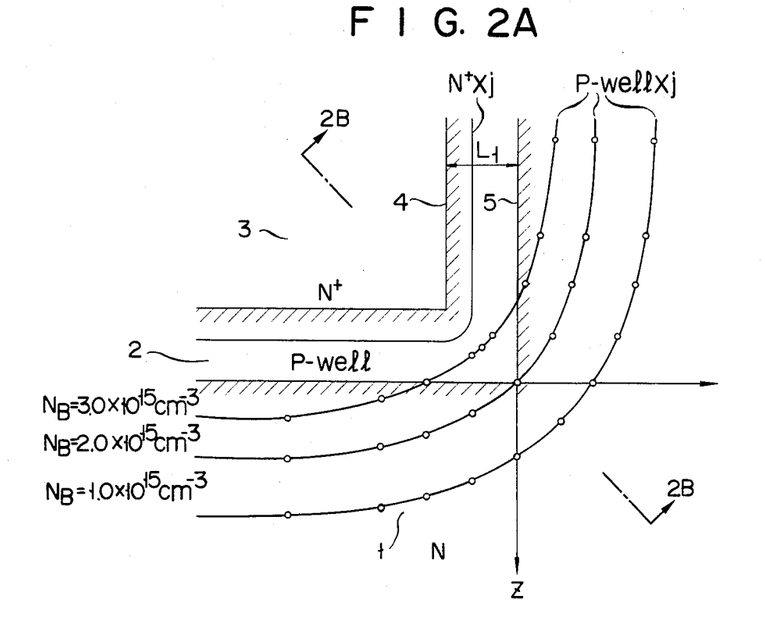
FIG. 2(a) and FIG. 3(a) are plan views illustrating the impurity atom density profile in the vicinity of the corners of the mask.
Figure 2B:
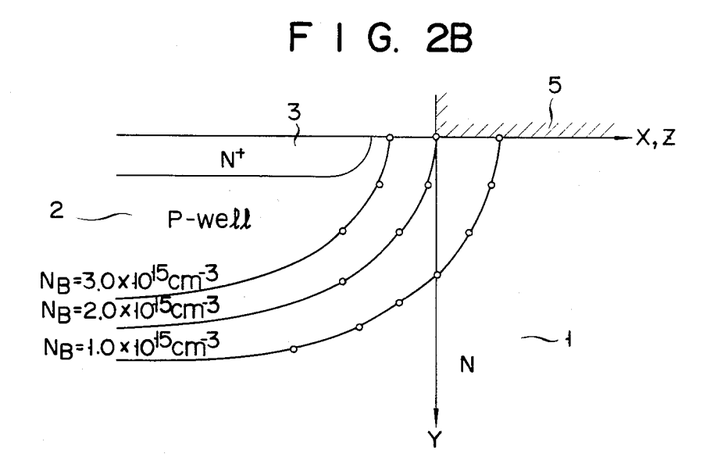
FIG. 2(b) and FIG. 3(b) are sectional views along the line 21(b)–21(b) of FIG. 2(a) and along the line 3(b)–3(b) of FIG. 3(a), respectively.

FIG. 2(a) is a plan view illustrating the impurity atom density profile in the corner of the p-well (2) shown in FIG. 1. FIG. 2(b) is a sectional view along the line 2(b)-2(b) of FIG. 2(a). In FIGS. 2(a) and (b), numeral (1) denotes an n-type silicon body; (2), a p-well; (3), an n+ source area formed in the p-well; (4), a mask used in forming the area (3); and (5), a mask used in forming the p-well (2). The material of the mask is usually a photoresist or silicon oxide.

As may be seen FIG. 2(a), $X_j$ of the p-well, defining the area of the p-well (2) (boundary between the p-type area and the n-type area), is closest to $X_j$ of the n+ source area (3) in the corners of the p-well (2). In particular, when the ratio of the impurity atom concentration of the p-well (2) to the impurity atom concentration of the silicon body (1) is small, that is, when the $N_B$ (impurity atom concentration) of the body (1) in FIG. 2(a) is $3.0 \times 10^{15}$ cm$^{-3}$, for example, the distance between $X_j$ of the p-well (2) and $X_j$ of the n+ source (3) is, sufficient at parts other than the corners, as shown in FIG. 2(a). However, the distance becomes extremely short at the corners, thereby causing punch-through phenomenon between the body (1) - the p-well (2) - the n+ area (3) at the corners.

A first conventional method for preventing the punch-through phenomenon at the corners is to secure a sufficient distance between the mask (4) and the mask (5). This distance is shown as $L_1$ in FIG. 2(a). A second method is to decrease the impurity atom concentration ($N_B$) of the silicon body (1). For example, $N_B = 1.0 \times 10^{15}$ cm$^{-3}$ in FIG. 2(a). These methods are not, however, preferable in that they adversely affect the densification, that is the achievement of a high component density. Further, the use of a silicon body having a small impurity atom concentration limits the range of use of the silicon wafers, rendering the manufacturing cost of a semiconductor device disadvantageously high.

Figure 3A:
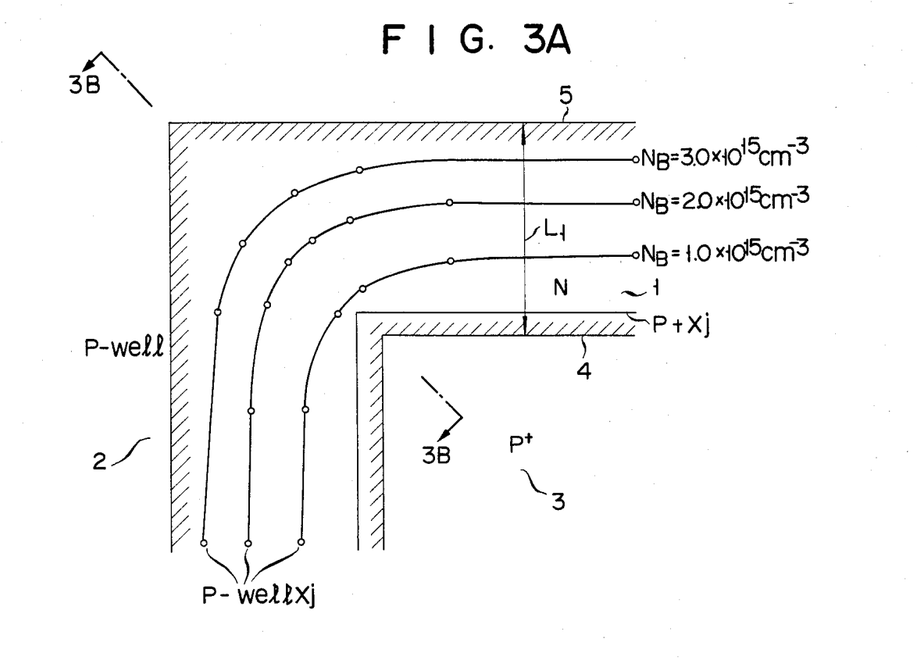
Figure 3B:
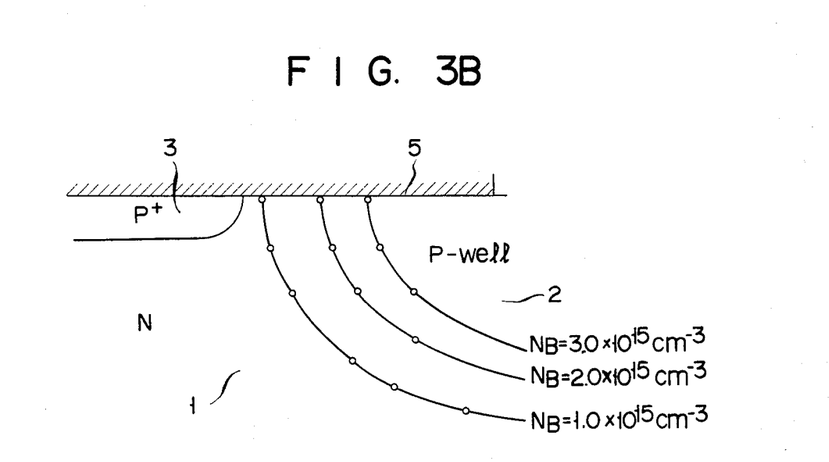

FIG. 3(a) is a plan view illustrating the corners of the p-well (2) formed in the surface of the n-type silicon body (1) and the profile of the corners of the p+ source or drain area (3) of a p-channel MOS FET formed in the surface of the body (1) in positions corresponding to the former corners. FIG. 3(b) is a sectional view along the line 3(b)-3(b) of FIG. 3(a). As may be apparent from FIG. 3(a), $X_j$ of the p-well (2) and $X_j$ of the p+ area (3) are closest in opposite corner positions. Accordingly, it is obvious that punch-through phenomenon is caused between the n-type silicon body (1) - p-well (2) - p+ area (3) at these close parts, as in the case of FIG. 2(a).

As may be apparent from FIG. 3(a), when the impurity atom concentration ($N_B$) of the silicon body (1) is as high as $3.0 \times 10^{15}$ cm$^{-3}$, the distance between $X_j$ of the p-well area (2) and $X_j$ of the p+ area (3) at the corners is sufficient. However, this apparently adversely affects the high component density of a semiconductor device and limits the impurity concentration range of the silicon wafers used. In FIG. 3(a), numeral (4) denotes a mask for forming the p+ area (3); 5, a mask for forming the p-well (2); and $L_1$, the distance between the masks (4) and (5).

One object of the present invention is to provide a method for obtaining a higher-integrated semiconductor device.

Another object of the present invention is to provide a semiconductor device and a method for its manufacturing in which the punch-through phenomenon at the corners of the impurity area is prevented.

A further object of the present invention is to provide a method for preventing a punch-through phenomenon at the corners of the impurity area without using a silicon body having an impurity atom concentration limited to a narrow range.

A further object of the present invention is to provide a method for controlling the shape of the corners of the impurity area.

One aspect of the present invention provides a method for manufacturing a semiconductor device comprising forming an impurity area by supplying an impurity in a semiconductor substrate; the amount of the impurity defining the corners of the impurity area is adjusted for control of the shape of the corners.

In this method, adjustment of the amount of the impurity can be accomplished by supplying the impurity in the substrate by using a mask whose corner portions are enlarged or reduced for increasing or reducing the opening area of the mask. This adjustment may alternatively be accomplished by supplying an impurity of conductivity type opposite to that of the impurity area to the parts where the corners are to be formed, before or after the impurity area is formed.

In a second aspect of the present invention, there is provided a semiconductor device having a first area of one conductivity type formed in a semiconductor substrate of the opposite conductivity type; and a second area which is formed for facing the corners of said first area and which is of the same conductivity type as said substrate; wherein the distance between corresponding corners of said first and said second areas is not smaller than that between said first and second areas excluding said corners.

In a semiconductor device according to the second aspect, the first area is formed by introducing an impurity of conductivity type opposite to that of the substrate into the substrate by using a mask whose corner portions are enlarged for increasing the opening area of the mask.

In a semiconductor device according to the second aspect, the second area is formed by supplying an impurity of the same conductivity type as that of the substrate to the first area by using a mask whose corners are reduced for reducing the opening area of the mask, thereby reducing the corners of the second area. This reduction of the second area may be accompanied by supplying to the corners of the second area an impurity of the same conductivity type as that of the first area before or after forming the second area.

In a semiconductor device according to the second aspect of the present invention, the enlargement of the first area may be accompanied by supplying to the corners of the first area an impurity of the same conductivity type as that of the first area before or after forming the first area.

In a third aspect of the present invention, there is provided a semiconductor device having a first area which is formed within a semiconductor substrate of one conductivity, which has inwardly protruding corners, and which has a conductivity opposite to that of the substrate; and a second area which is formed in the surface of the substrate, which has the same conductivity type as that of the first area, and which has corners facing the inwardly protruding corners of the first area; wherein the distance between corresponding corners is not smaller than the distance between the first and second areas excluding the corners.

In a semiconductor device according to the third aspect of the present invention, the first area is formed by introducing an impurity of conductivity type opposite to that of the substrate into this substrate using a mask whose corners are inwardly enlarged or protruded for reducing the opening area of the mask, whereby the corners of the first area are inwardly enlarged.

In a semiconductor device according to the third aspect of the present invention, the second area is formed by supplying to the substrate an impurity of the same conductivity type as that of the first area using a mask whose corners are reduced for reducing the opening area of the mask, thereby reducing the corners of the second area. In a semiconductor device according to the third aspect of the present invention, the reduction of the corners of the second area may be accompanied by supplying an impurity of the same conductivity type as that of the substrate to the corners of the second area before or after forming the second area.

In a semiconductor device according to the third aspect of the present invention, the inward enlargement of the corners of the first area may be accompanied by supplying an impurity of the same conductivity type as that of the first area to the inwardly recessed corners of the first area before or after forming the first area.

In a semiconductor device according to the second aspect of the present invention, the first area comprises a p-well of a complementary MOS, and the second area comprises a source or a drain of an n-channel MOS transistor.

In a semiconductor device according to the third aspect of the present invention, the first area comprises a p-well of a complementary MOS, and the second area comprises a source or a drain of a p-channel MOS transistor.

In a semiconductor devices according to the second or third aspect of the present invention, the distance between the first and second areas is preferably substantially constant.

In the present invention, the supply of an impurity into the semiconductor material for forming an impurity area is performed by diffusion or ion implantation.

This invention can be more fully understood from the following detailed description when taken in conjunction with the accompanying drawings, in which:

FIG. 4 is a plan view illustrating the impurity atom density profile in the corners of the opposing first and second areas in a first embodiment of the semiconductor device according to the second aspect of the present invention.

In FIG. 4, numeral (1) denotes an n-type silicon body; (2), a p-type first area formed in the surface of the body (1), for example, a p-well of a complementary MOS: (3), an n+ second area formed in the p-well (2), for example, a source or a drain of an n-channel MOS FET; (4), a mask for forming the n+ area (3); (5), a mask for forming the p-well (2); and L$_2$, the distance between the masks (4) and (5). In FIG. 4, the same numerals designate similar parts as in FIG. 2.

As may be apparent from FIG. 4, the mask (5) is so shaped that its corners are enlarged for increasing its opening area, and the enlarged part of the opening edges forms a rectangular shape. Accordingly, when the n-type impurity is supplied to the n-type body (1) using the mask (5) of this shape, that is, with its corners enlarged, the p-type impurity for forming the corners of the p-well (2) is in greater relative supply as compared to the case when the corners of the mask are not enlarged. As a result, the corners of the p-well (2) are enlarged, and the distance between X$_j$ of the n+ area (n+ X$_j$) and X$_j$ of the p-well (p-well X$_j$) is kept substantially constant, thus preventing the local proximity of the corners of the N+ X$_j$ and the p-well X$_j$. Accordingly, since the position of the p-well X$_j$ at the corners can be compensated with respect to the n+ X$_j$, the punch-through phenomenon at the corners of the n+ X$_j$ and the p-well X$_j$ can be prevented, even in the case wherein the distance L$_2$ between the mask (4) and the mask (5) is smaller than in conventional cases.

Figure 5:
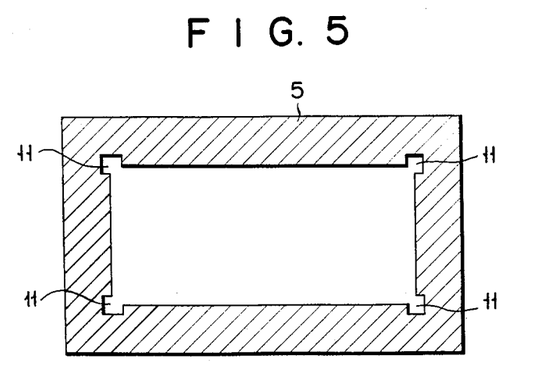
FIG. 5 is a plan view illustrating the overall appearance of the mask for forming a p-well in the embodiment of FIG. 4.

FIG. 5 is an overall plan view of an example of a mask for forming the p-well (2) wherein numeral (11) denotes an enlarged part of the opening part of the mask.

Figure 6A:
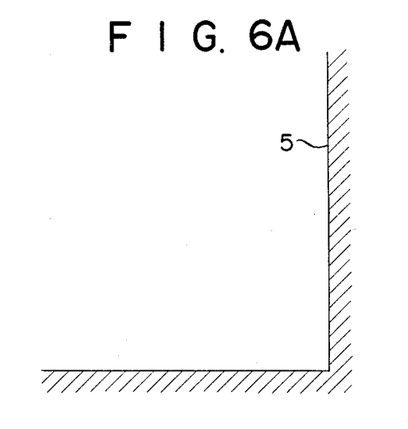
FIGS. 6(a) and 6(b) are schematic plan views of a mask used in FIG. 6(c)
Figure 6B:
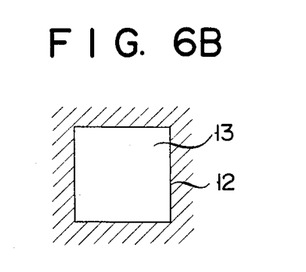
Figure 6C:
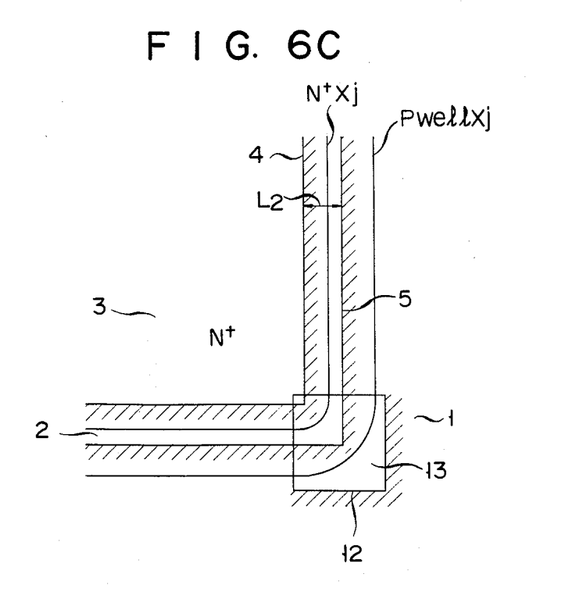
FIG. 6(c) is a view illustrating a modification of the embodiment of FIG. 4.

FIG. 6 shows a modification of FIG. 4. The mask (5) in FIG. 6(a) for forming the p-well and the mask (12) with an opening (13) shown in FIG. 6(b), render the same effects as derived in FIG. 4. As shown in FIG. 6(c), a p-type impurity is supplied to the corners of the p-well using the mask (12) before or after the supply of the p-type impurity using the mask (5). As a result of this, the corners of the p-well are compensated with impurity due to the supply of it from the opening (13) of the mask (12), so that the undesirable closeness of the corners of the p-well X$_j$ and the n+ X$_j$, and hence the generation of the punch-through phenomenon, is prevented. An embodiment of the method for manufacturing a semiconductor device wherein the p-well is formed in two separate steps includes the following steps:

(1) preparing an n-type silicon wafer (N$_B$=1.0 to 3.0×10$^{15}$ cm$^{-3}$);
(2) oxidizing the surface of this wafer;
(3) forming the mask (5) shown in FIG. 6(a) by photoetching;
(4) supplying boron ions (amount, 1.0×10$^{13}$ cm$^{-2}$) by ion implantation using this mask (5);
(5) forming the mask (12) shown in FIG. 6(b) by photoetching;
(6) supplying boron ions (amount, 2.0×10$^{13}$ cm$^{-2}$ by ion implantation through the opening (13) of the mask (12);
(7) heating at 1200° C. for slumping;
(8) forming the mask (4) shown in FIG. 6(c) by photoetching; and
(9) forming the n+ area (3) by diffusing the n-type impurity using the mask (4).

Figure 7A:
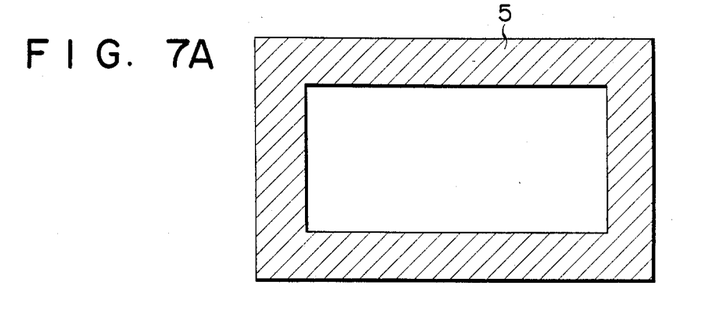
FIG. 7(a) is a plan view illustrating the overall appearance of the entire mask of FIG. 6(a)
Figure 7B:
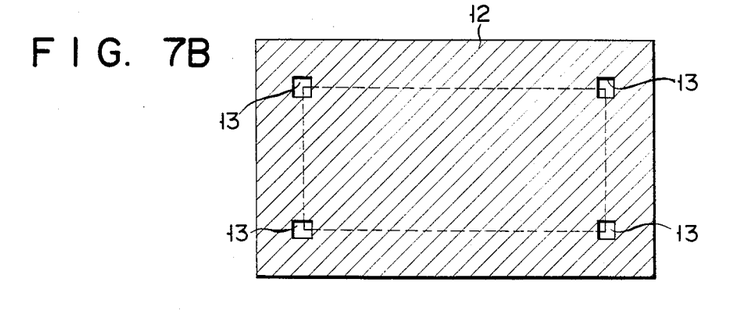
FIG. 7(b) is an overall plan view of the entire mask of FIG. 6(b)

FIGS. 7(a) and 7(b) are plan views illustrating the overall appearance of the masks of FIG. 6(a) and 6(b), respectively.

Figure 8:
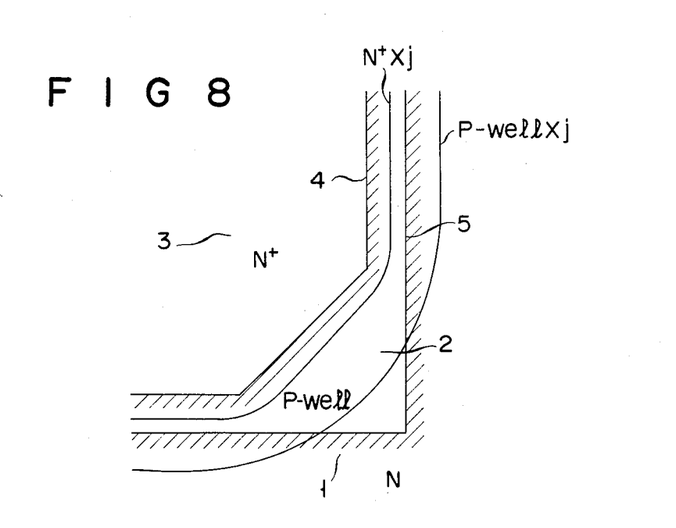
FIG. 8 is a view illustrating a modification of the embodiment of FIG. 4.

FIG. 8 shows an example according to the second aspect of the present invention wherein the n+ area (3) is formed by supplying an impurity of the same conductivity type as that of the n-type silicon body (1) to the p-well (2) of the first area by using a mask (4) whose corners are reduced for reducing the opening area of the mask. As may be seen from FIG. 8, the mask (4) whose corners are reduced has opening edges which look as if they were formed on a right triangle. The X$_j$ of the n+ area (3) formed by using the mask (4) of such a shape can maintain a sufficient distance at the corners with respect to the X$_j$ of the p-well (2), thereby eliminating the punch-through phenomenon. In other words, since the distance between the mask (4) for forming the n+ area and the mask (5) for forming the p-well can be shortened, densification of the integrated circuits can be facilitated.

Figure 9:
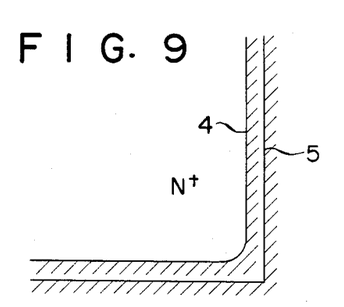
FIGS. 9 to 11 are schematic plan views illustrating modifications of the mask used in the example shown in FIG. 8.
Figure 10:
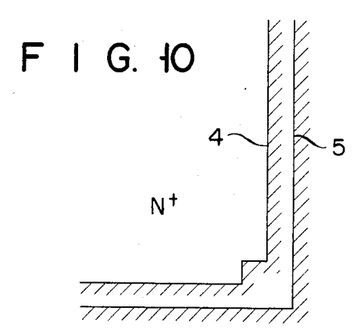
Figure 11:
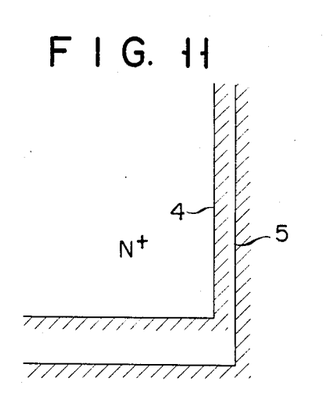

FIGS. 9 to 11 are views illustrating variations of the embodiment shown in FIG. 8 wherein FIG. 9 shows the rounded edges of the corners of the mask (4); FIG. 10 shows an example of the mask (4) whose edges look as if their corners were formed by embedding a square; and FIG. 11 shows an example of the mask (4) with one side inwardly protruded so as to reduce the opening area of the mask. In all of these examples, the distance between the mask (4) for forming the n+ X$_j$ and the mask (5) for forming the p-well X$_j$ is increased at corresponding corners. Hence, the distance between the corners of the n+ X$_j$ and the p-well X$_j$ formed by the masks (4) and (5) is also increased. In FIGS. 9 to 11, the n+ X$_j$ and the p-well X$_j$ are omitted.

Figure 12:
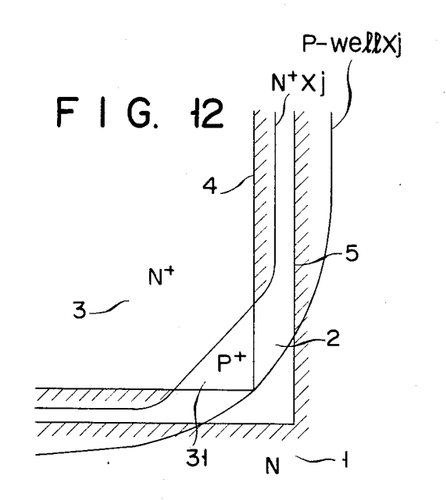
FIG. 12 is a view illustrating a modification of the embodiment of FIG. 4.

FIG. 12 shows an example according to the second aspect of the present invention wherein a triangular p+ area (31) is formed by supplying an impurity of the same conductivity type as that of the first area (p-well) to the corners of the n+ area (3) before or after the second area, (n+ area 3) is formed, thereby securing a sufficient distance between the n+ X$_j$ and the p-well X$_j$ at the corners. The corners of the mask (4) for forming the n+ area (3) before or after the p+ area (31) may be such that its corners are reduced as seen in the mask (4) shown in FIG. 8. Alternatively, it may be such that its corners are right angled as seen in the mask (4) shown in FIG. 4. In forming the n+ area (3) by using the mask (4) with right angled corners, the concentration of the p-type impurity must be higher than the concentration of the n+ area (3). Although the p+ area (31) may be formed before or after the n+ area (3), it is preferably formed simultaneously with the other p+ diffused areas constituting an integrated circuit including CMOS. The depth of the p+ area (31) is preferably shallower than the depth of the p-well but is the same as or deeper than the depth of the n+ area (3).

Figure 13:
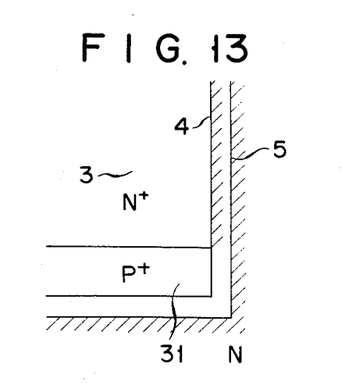
FIGS. 13 to 16 are plan views illustrating modifications of a method for forming a p+ area (31) in FIG. 12.
Figure 14:
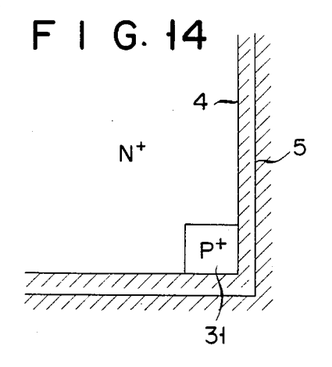
Figure 15:
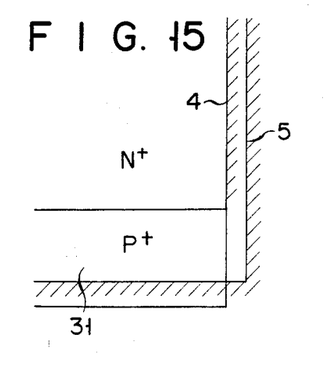
Figure 16:
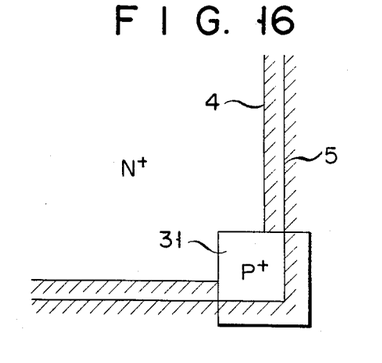

FIGS. 13 to 16 show other embodiments of the example of FIG. 12. FIG. 13 shows an example wherein the shape of the p+ area (31) is rectangular and is parallel to one side of the N+ area (3). FIG. 14 is an example wherein the shape of the p+ area (31) is square instead of triangular. FIG. 15 is an example wherein the shape of the p+ area (31) is such that it protrudes beyond one side of the mask (5) for forming the p-well (5). FIG. 16 is an example wherein the shape of the p+ area (31) is such that it protrudes beyond the corners of the mask (5).

Figure 17:
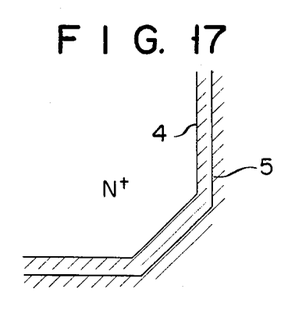
FIGS. 17 and 18 are views illustrating modifications of the embodiment of FIG. 4.
Figure 18:
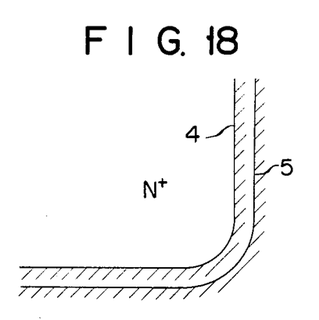

In the examples shown in FIGS. 17 and 18, the punch-through phenomenon at the corners is prevented by inwardly reducing the corners of the mask (4) for forming the n+ area and the mask (5) for forming the P-well, thereby reducing the angles of the corners of the n+ area and the p-well.

In FIG. 17, the edges of the masks (4) and (5) are so shaped that the right angled corner is obliquely cut away. In FIG. 18, the edges of the corners of both masks (4) and (5) are curved.

Figure 19:
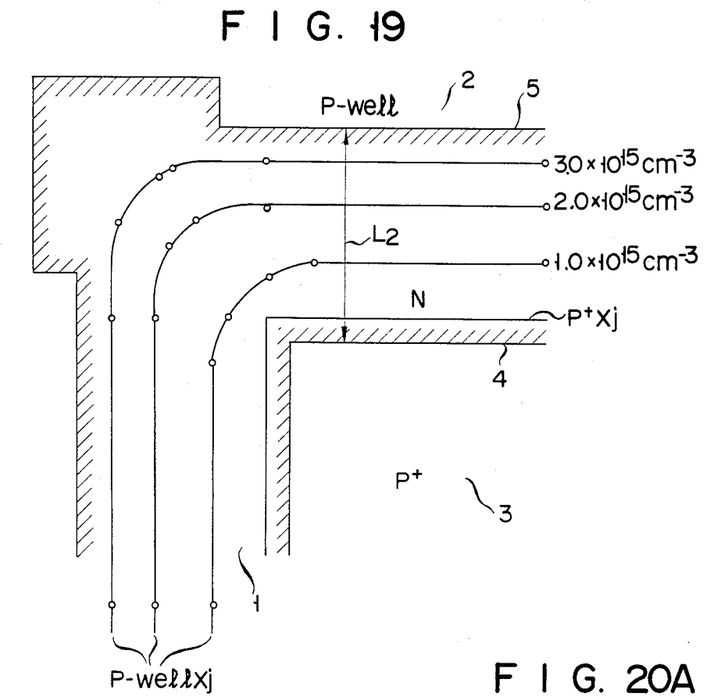
FIG. 19 is a plan view of the impurity atom density profile in the vicinity of the corners of a mask in another embodiment of the present invention.

FIG. 19 shows an example according to the third aspect of the present invention wherein the first area, the p-well (2), is formed by supplying a p-type impurity to the n-type silicon body (1) by using the mask (5) whose corners are inwardly recessed or protruded for reducing the opening area of the mask. As may be seen from FIG. 19, the corners of the p-well (2) are change so that, the distance between the p-well $X_j$ and the p+ $X_j$ is greater at the corners than in the conventional case shown in FIG. 3. Accordingly, it is possible to shorten the distance $L_2$ between the mask (5) for forming the p-well and the mask (4) for forming the p+ area as compared to the case shown in FIG. 3. In FIG. 19, the same numerals denote similar parts as in FIG. 3.

Figure 20A:
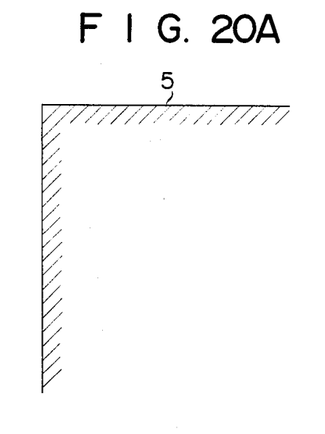
FIGS. 20(a) to 20(c) are views illustrating a modification of the example of FIG. 19.
Figure 20B:
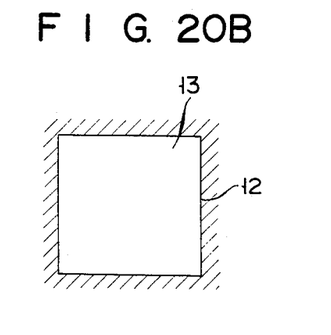
Figure 20C:
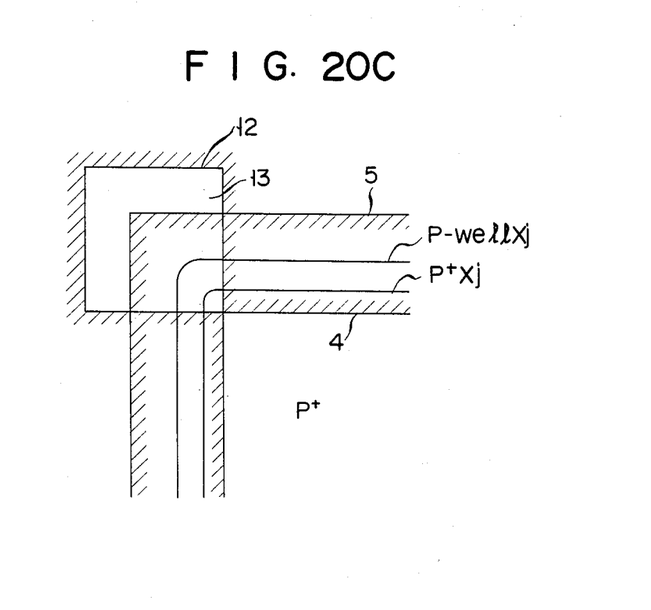

FIG. 20(c) shows an example wherein the mask (5) for forming the p-well as shown in FIG. 20(a) and the mask (12) with the opening (13) for forming the p+ area (3) as shown FIG. 20(b) are used in separate steps for obtaining the same effects as obtained in the example shown in FIG. 19.

Figure 21:
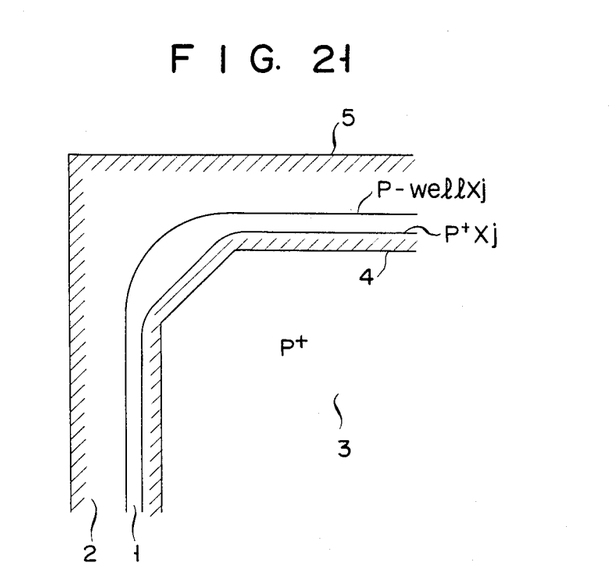
FIGS. 21 to 31 are views illustrating modifications of the example shown in FIG. 19.

FIG. 21 shows an example according to the third aspect of the present invention wherein the p-well whose corners are reduced is formed by supplying a p-type impurity to the n-type silicon body (1) by using the mask (4) whose corners are reduced for reducing the opening area of the mask. As may be seen from FIG. 21, the edges of the corners of the mask (4) are shaped as if the right angled inner corners have been obliquely cutaway, so that the undesirable closeness between the p-well $X_j$ and the p+ $X_j$ is prevented.

Figure 22:
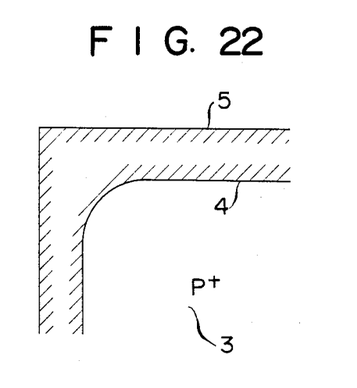
Figure 23:
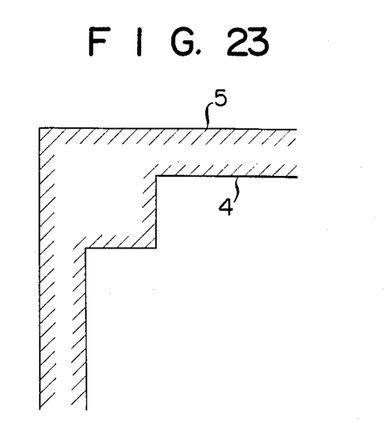
Figure 24:
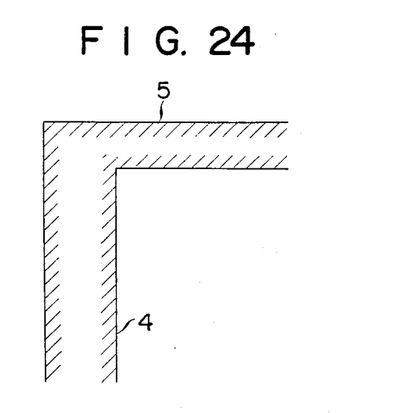

FIGS. 22 to 24 show modifications of the example shown in FIG. 21. FIG. 22 shows an example of the mask (4) wherein the edges of the corners of the mask are rounded. FIG. 23 shows an example of the mask 4 which looks as if a square were embedded in the corner of the mask 4. FIG. 24 shows an example of the mask (4) wherein one side of each corner of the mask (4) is spaced apart from the mask (5) more than the other side. In these three examples, the distance between the masks (4) and (5) is increased at the corners.

Figure 25:
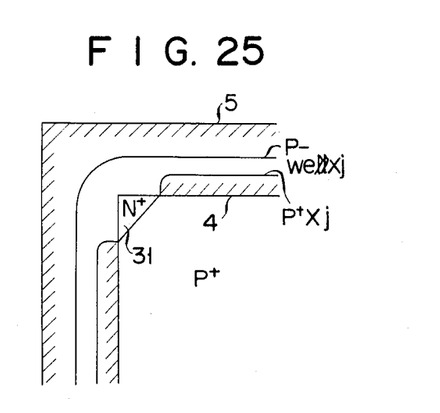

FIG. 25 shows an example according to the third aspect of the present invention wherein a triangular area (31) is formed by supplying an n-type impurity of the same conductivity type as that of the silicon body (1) to the corners 93 of the p+ area (3) before or after the formation of the p+ area (3) (the second area), thereby securing a sufficient distance between the p+ $X_j$ and the p-well $X_j$ at the corners. The particular means for forming the n+ area (31) as well as the depth of the n+ area (31) are substantially the same as described in the case of forming the p+ area (31) shown in FIG. 12.

Figure 26:
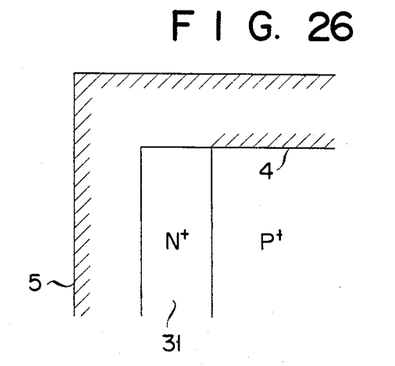
Figure 27:
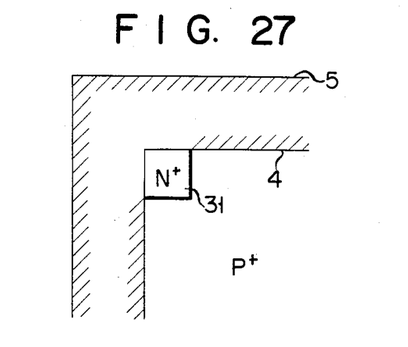
Figure 28:
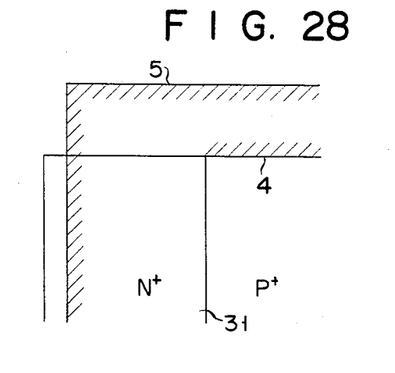
Figure 29:
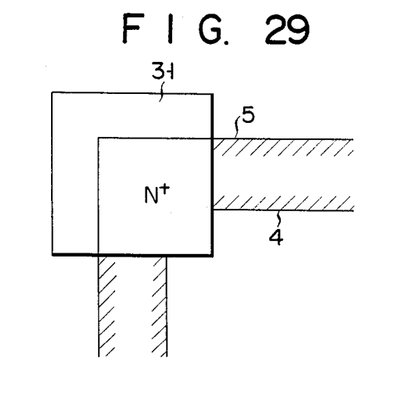
Figure 30:
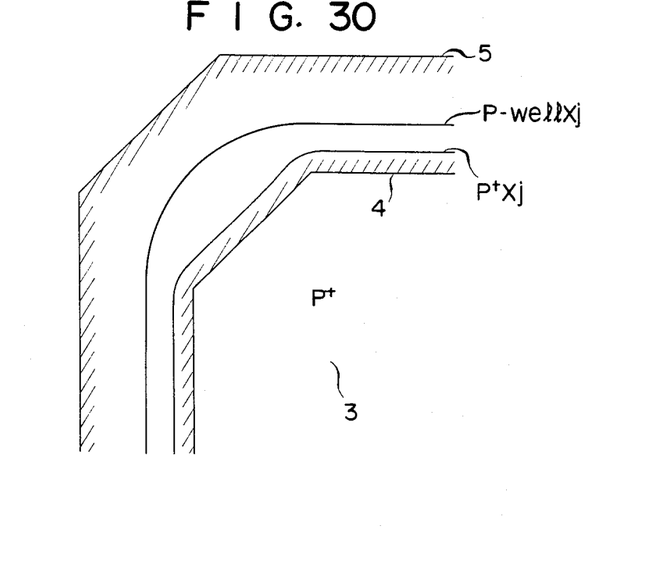
Figure 31:
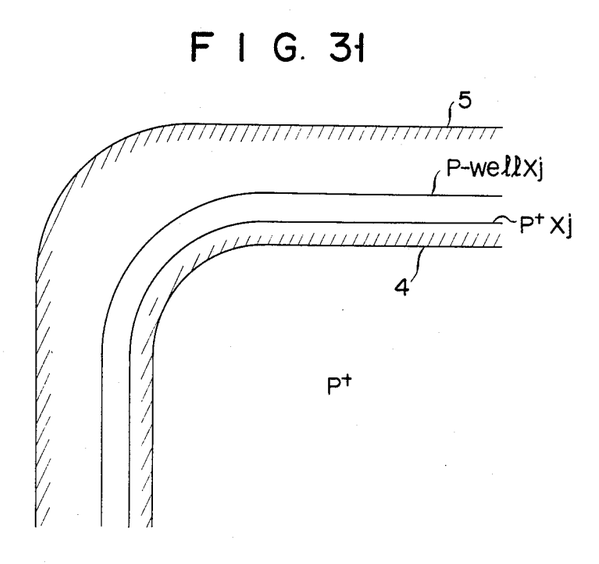

FIGS. 26 through 29 show modifications of the example shown in FIG. 25. FIG. 26 shows an example wherein the n+ area (31) is rectangular and parallel to one side of the p+ area (3). FIG. 27 shows an example wherein the shape of the n+ area is square. FIG. 28 shows an example wherein the n+ area (31) is such that it protrudes beyond one side of the mask (5) for forming the p-well. FIG. 29 shows an example wherein the shape of the n+ area is such that it protrudes beyond the corners of the mask (5). FIGS. 30 and 31 show examples wherein the angles of the corners between the p-well $X_j$ and the p+ $X_j$ are made smaller, these examples corresponding to the cases of FIGS. 17 and 18. In FIGS. 30 and 31, the inwardly protruding corners of the mask (5) are outwardly enlarged for increasing the opening area of the mask, and the corners of the mask (4) are reduced for reducing the opening area of the mask. As a result, the distance between the p-well $X_j$ and the p+ $X_j$ is, at the corners, made smaller than at the parts excluding the corners.

Figure 32:
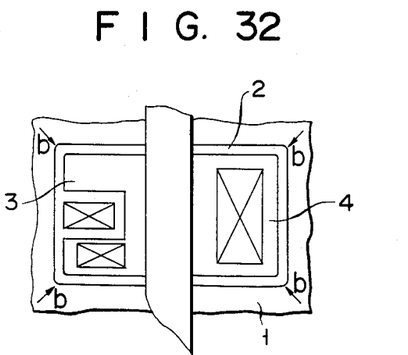
FIG. 32 is a plan view of a semiconductor device according to an embodiment of the present invention.

FIG. 32 is schematic plan view illustrating the CMOS RAM according to one embodiment of the semiconductor device of the present invention. The distance between the p-well (2) and the n+ source area (3) or the n+ drain area (4) is apparently greater at the corners (b) as compared to the case shown in FIG. 1. The punch-through phenomenon will not thus occur at the corners.

Although this description has been made with reference to CMOS FET having p-well in the above embodiments, the present invention can also be applied to CMOS FET having n-well, or integrated circuit device wherein p-well and n-well are alternately disposed.

In summary, the present invention is advantageous in facilitating a higher integration in a semiconductor device since the distance between a plurality of impurity containing areas formed in the semiconductor substrate can be shortened. It is also advantageous in that a semiconductor substrate with a wider impurity atom concentration can be used, thereby lowering the manufacturing cost of the semiconductor device.

What is claimed is:

1. A semiconductor device comprising:
   a substrate of a first conductivity type;
   a first semiconductor area formed in said semiconductor substrate and having a second conductivity type opposite to said first conductivity type, said first area including a first corner; and
   a second semiconductor area of said first conductivity type formed in said first area, said second area having a second corner aligned with said first corner and formed such that the distance between said substrate and said second area, measured laterally with respect to the surface of said substrate, is at a maximum at said first and second corners in order to prevent a punch-through at said first and second corners.

2. A device as claimed in claim 1 wherein said first area comprises a p-well complementary MOS and said second area comprises a source or a drain of an n-channel MOS transistor.

3. A device as claimed in claim 1 wherein said first area comprises an n-well of a complementary MOS and said second area comprises a source or a drain of a p-channel MOS transistor.

* * * * *